(12) United States Patent
Llapitan et al.

(10) Patent No.: US 7,867,003 B2
(45) Date of Patent: Jan. 11, 2011

(54) WIRE BALE INDEPENDENT LOAD MECHANISM

(75) Inventors: David J. Llapitan, Tacoma, WA (US); Jerry A. Kaliszewski, Olympia, WA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 12/344,173

(22) Filed: Dec. 24, 2008

(65) Prior Publication Data

US 2010/0159730 A1 Jun. 24, 2010

(51) Int. Cl.
*H01R 13/62* (2006.01)

(52) U.S. Cl. .................................... 439/331

(58) Field of Classification Search ............. 439/331, 439/329, 73, 72, 342, 341
See application file for complete search history.

(56) References Cited

U.S. PATENT DOCUMENTS

| | | | | |
|---|---|---|---|---|
| 6,101,091 | A * | 8/2000 | Baik ........................... | 361/704 |
| 6,159,031 | A | 12/2000 | Llapitan et al. ............. | 439/326 |
| 6,327,147 | B1 | 12/2001 | Llapitan et al. ............. | 361/704 |
| 6,585,534 | B2 | 7/2003 | Llapitan et al. ............. | 439/327 |
| 6,657,868 | B1 | 12/2003 | Hsue ........................... | 361/728 |
| 6,722,908 | B2 | 4/2004 | Llapitan et al. ............. | 439/327 |
| 6,762,932 | B2 | 7/2004 | Regimbal et al. ........ | 361/679.33 |
| 6,847,521 | B2 | 1/2005 | Beall et al. ............. | 361/679.02 |
| 6,860,693 | B2 | 3/2005 | Jones et al. ................ | 411/433 |
| 7,126,828 | B2 | 10/2006 | Beall et al. .................. | 361/801 |
| 7,147,483 | B1 * | 12/2006 | Ju ............................... | 439/73 |
| 7,203,067 | B2 | 4/2007 | Beall et al. .................. | 361/726 |
| 7,371,100 | B1 * | 5/2008 | Polnyi ......................... | 439/331 |
| 7,453,707 | B2 | 11/2008 | Beall et al. .................. | 361/796 |
| 7,455,526 | B1 | 11/2008 | Ila et al. ....................... | 439/41 |
| 7,604,486 | B2 | 10/2009 | Martinson et al. ............. | 439/70 |
| 7,623,344 | B2 | 11/2009 | Beall et al. ............. | 361/679.48 |
| 2010/0157563 | A1 | 6/2010 | Llapitan et al. ............. | 361/807 |

* cited by examiner

*Primary Examiner*—Phuong K Dinh
(74) *Attorney, Agent, or Firm*—Konrad Raynes & Victor LLP; Alan S. Raynes

(57) ABSTRACT

Electronic assemblies are described. One embodiment includes a circuit board and a socket coupled to the circuit board. The assembly also includes a load mechanism including a first lever arm and a second lever arm. The load mechanism also includes a first axis portion extending from a first longitudinal end of the first lever arm, the first axis portion pivotally coupled to the circuit board, and a second axis portion extending from a first longitudinal end of the second lever arm, the second axis portion pivotally coupled to the circuit board. The load mechanism also includes a first load arm region extending from the first axis portion and the second axis portion and positioned between the first and second lever arms. The load mechanism also includes a first handle region at a second longitudinal end of the first lever arm, and a second handle region at a second longitudinal end of the second lever arm. The load mechanism also includes a second load arm region extending from the first handle region, and a third load arm region extending from the second handle region, the second and third load arm regions positioned between the first and second lever arms. The load mechanism also includes a gap positioned between an end of the second load arm and an end of the third load arm. The load mechanism is coupled to the circuit board. Other embodiments are described and claimed.

18 Claims, 4 Drawing Sheets

WIRE BALE INDEPENDENT LOAD MECHANISM

RELATED ART

An integrated circuit (IC) package is used to electrically couple an IC die to external components and circuitry. The IC package typically includes a die (for example, a silicon chip) coupled to a package substrate, with electrical contacts from the die coupled to electrical contacts on one side of the package substrate, which are in turn electrically coupled to external contacts on the other side of the package substrate. The external contacts of the package may include any suitable structure, including, but not limited to, pins and solder bumps arranged in any suitable pattern.

The external contacts of an IC package may be mounted directly to the electrical contacts of a structure such as a printed circuit board (for example, a motherboard). Alternatively, sockets have been devised to attach an IC package to electrical contacts of a board. The sockets may be designed to permit the IC package to be easily removed from the board. For example, electrical contacts of an IC package may be removably coupled to first contacts of a socket, and second contacts of the socket may be coupled to a board.

In order to ensure a suitable electrical contact between an IC package and the socket contacts, some architectures require the application of a force to press the contacts of the socket against corresponding contacts of the package. If the force is not within a specified range pertinent to the socket, this may cause undesirable stresses in the system, leading to damage in the IC package, the socket, the package/socket interface, and/or the socket/board interface.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic assemblies and mechanisms for applying a force to an electronic component.

An independent load mechanism (ILM) may be used to apply a load force to a package so that the package can make contact with the contacts on a socket coupled to a circuit board. Existing ILM structures have applied the load force to an integrated heat spreader (IHS) positioned on the die in a package. The load is typically a 2 point load that travels though the heat spreader to the die. If the load is too large, it can damage the die and/or solder bumps under the heat spreader. Certain embodiments utilize a wire bale ILM structure, in which a wire component is configured to apply a distributed load to the electronic component.

FIG. 1-4 illustrate view of various components in an electronic assembly including an independent load mechanism, in accordance with certain embodiments. The electronic assembly includes a circuit board 10 having a socket 12 coupled thereto. A package 14 is positioned in the socket 12. The assembly may include a stiffener 16 on the package 14.

Figure 1:
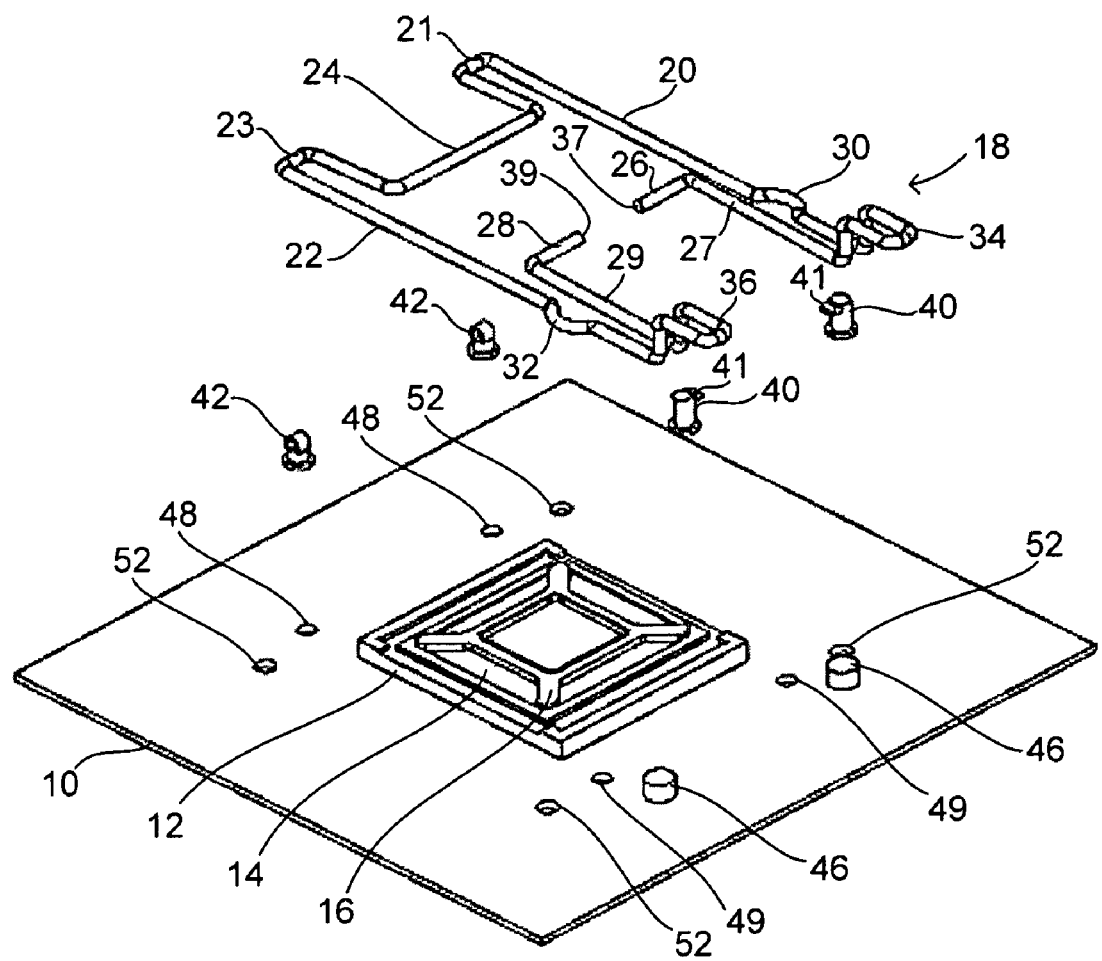
FIG. 1 is an exploded view of certain components in a system in accordance with certain embodiments.

As illustrated in the exploded view of FIG. 1, the load mechanism structure may be formed from a component 18 that is coupled to the board 10. The component 18 may be formed from any suitable material, for example, a wire having suitable mechanical properties that can be bent into the appropriate shape. The wire may be circular when viewed in cross section. While the component 18 may be discussed below as if formed from a wire, the material of the component 18 need not be a wire in all embodiments.

The component 18 is pivotally coupled to the board 10 using a suitable mounting mechanism, for example, a hinge or hook mechanism such as hook mechanisms 42 illustrated in FIG. 1. The hook mechanisms 42 may be coupled to the board 10 through apertures 48 in the board 10, and may be formed from any suitable material, for example, die cast aluminum. The component 16 includes first and second lever arms 20, 22 that are substantially parallel to each other and separated on a longitudinal end by axle portions 21, 23 and load arm region 24. The load arm region 24 is substantially U-shaped, including a region extending inward from each of the axle portions 21, 23 and a central portion that will engage the package 14 during operation. At the longitudinal end of the first lever arm 20 leading to the axle portion 21, the wire forming the component 18 is bent at a 90 degree angle to form the axle portion 21, which will be coupled to a hinge or hook mechanism 42. After the position where the connection to a hook mechanism 42 is made, the wire forming the axle portion 21 is again bent at a 90 degree angle inward towards the interior region defined by the component 18, to form the load arm region 24. After extending a distance inward the wire is again bent at a 90 degree angle, extends a distance, and is again bent at a 90 degree angle outward to extend back towards the axle portion 23, to form the substantially U-shaped load arm region 24. The wire is again bent at a 90 degree angle to form the axle region 23, which will be coupled to the board 14 through another hook mechanism 42, and then bent 90 degrees again to form the second lever arm 22, as illustrated in FIG. 1.

The other longitudinal end of lever arm 20 includes a handle region 34 from which another load arm region 26 extends therefrom. The other end of the lever arm 22 includes a handle region 36 from which another load arm region 28 extends therefrom. The handle regions 34, 36 are formed to bend 180 degrees back towards the central region of the component 18, and extend to the load arm regions 26, 28, respectively. The load arms 26, 28 are each substantially L-shaped, with an inward bend of 90 degrees. The load arms 26, 28 are separated from one another by a gap between their ends 37, 39.

To apply a load to the package 14 in the socket 12 using the component 18, the handle regions 34, 36 are pressed down. The component 18 becomes engaged with latch mechanisms 40, which may be shaped to include a ramp portion 41 over which a portion of the component 18 can slide and then fit under. The latch mechanism may be formed from any suitable material, for example, die cast aluminum. This mechanism can be explained with reference to FIGS. 2-3.

Figure 2:
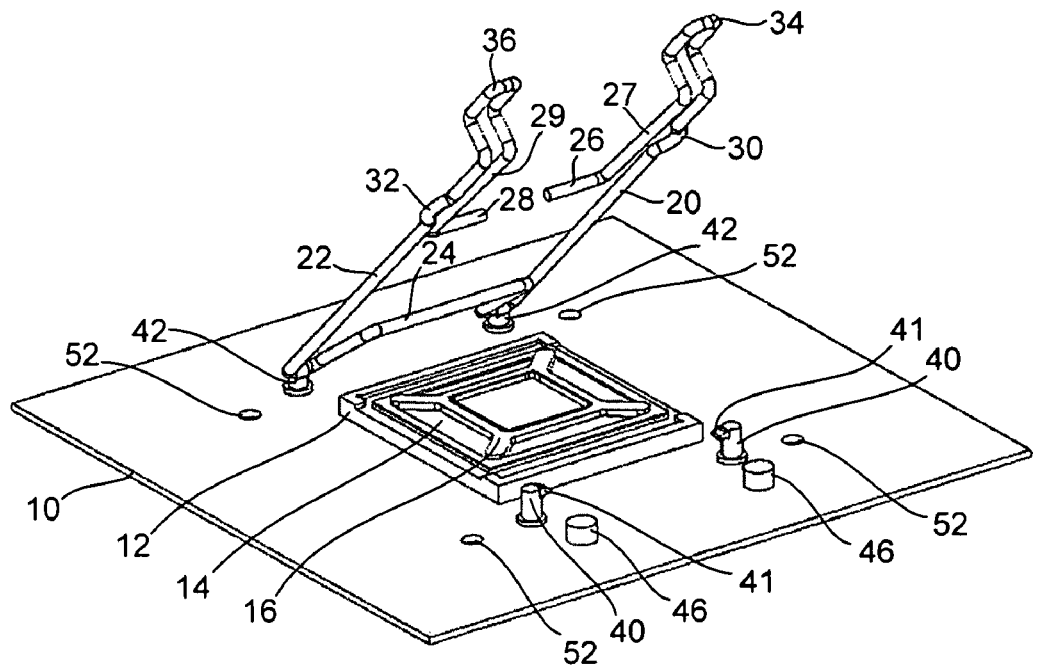
FIG. 2 is a perspective view of certain components in a system in accordance with certain embodiments.
Figure 3:
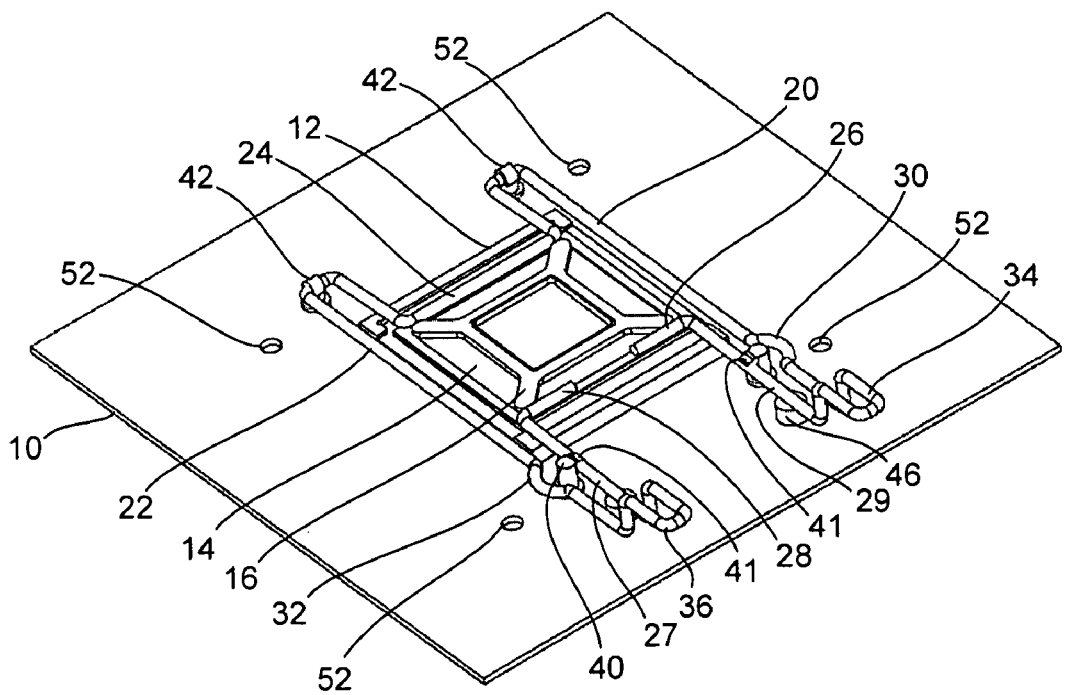
FIG. 3 is a perspective view of certain components in a system, in accordance with certain embodiments.

FIG. 2 illustrates an assembly with the axle portions 21, 23 coupled to the board 10 through hook mechanisms 42. FIG. 2 also shows the handle regions 34, 36 facing upward in an open position. FIG. 3 illustrates the handle regions in a closed position. As seen in FIG. 3, the portions 27, 29 of the load arm regions 26, 28 have engaged the latch mechanisms 40 and are positioned under the ramp portions 41. The ramp portions 41 may be formed to include an angled surface over which the portions 27, 29 of the load arms 26, 28 may slide. The gap between the ends 37, 39 of the load arm regions 26, 28 permits the component 18 to be able to flex inward, thus permitting the portions 27, 29 to slide down and then under the angled ramp surface 41 and be held in place. When it is desired to open the component 18, the handle regions 34, 36 are squeezed inward, and the portions 27, 29 can move to the inside of and over the ramp regions 41 of the latch mechanisms 40. Other suitable latching mechanisms may also be used.

Figure 4:
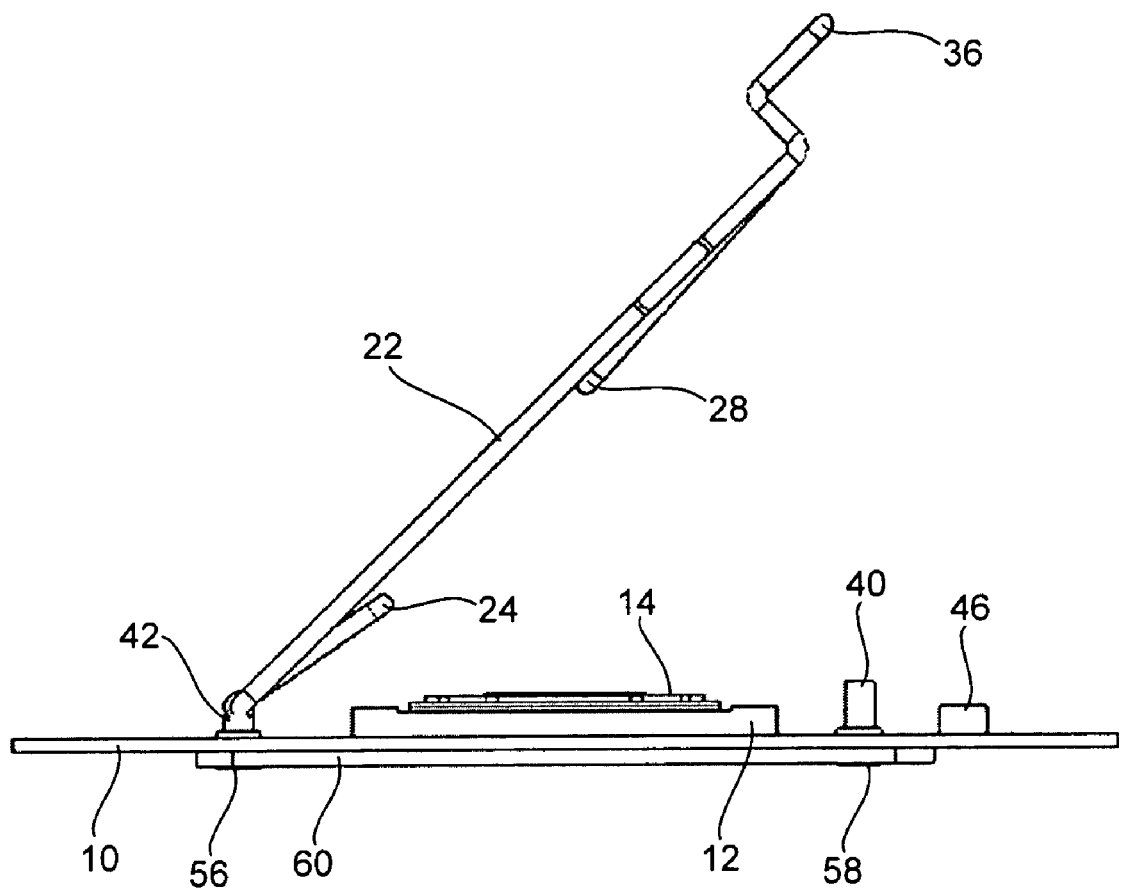
FIG. 4 is a side view of certain components in a system, in accordance with certain embodiments.

FIG. 4 illustrates a side view of the component in an open position on the board 14. The hook mechanisms 42, the latch mechanisms 40, and the stoppers 46 may be coupled to the board 10 using any suitable mechanism. As illustrated in FIG. 4, the hook mechanisms 42 may be coupled to the board 10 through apertures 48, using screws 56. The latch mechanisms 40 may be coupled to the board 10 through apertures 49, using screws 58. The screws 56, 58 also extend through mounting plate 60 positioned on the lower surface of the board 10. The stoppers 46 may be coupled to the board using an adhesive (not shown). FIGS. 1-3 also illustrate apertures 52 extending through the circuit board. These apertures 52 may be used for mounting additional components to the assembly. Such additional components may be mounted either before or after the load mechanism is actuated. One example of such a component is a heat sink.

When the component 18 is brought towards the component, the load arm regions 24, 26, 28 will contact the surface of the package 14. FIG. 4 illustrates that the load arm regions 24 and 28 (26 is blocked by 28) are bent downward relative to the lever arm 22 and will contact the package 14 as the component 18 is pivotted downward. Changing the downward angle of the load arm regions 24, 26, 28 can change the amount of force that will be applied to the package. Thus, it should be appreciated that the downward angle of the load arm regions 24, 26, and 28 may be varied in different embodiments. The structure of the component 18 permits a single application of force to the handle regions 34, 36 to apply a load through the load arm regions 24, 26, 28 to the package 14. The structure permits a relatively large load to be applied to the package 14 using, for example, two fingers.

The package 14 is engaged along a length of each of the load arm regions 24, 26, 28. This configuration, by spreading the load along the a length of the load arm regions 24, 26, 28, yields a more constant and better load spreading when compared with conventional load application designs. In addition, the component 18 may be configured so that the load force applied to the package 14 from the load arm region 24 is equal to the load force applied from the bad arm regions 26, 28. This may be accomplished by careful control of the bend positions and amounts during formation of the component 18.

Depending on the size of the component 18 and the configuration of the assembly, the load arms 26, 28 may have curved regions 30, 32 incorporated into the structure to permit sufficient space to fit around the latch mechanisms 40. The assembly may also include stoppers 46 positioned on the surface of the board 10, to control the distance the component 18 can be lowered. The handle regions 34, 36 may include a step-like bend upward so that the handle regions 34, 36 are positioned higher than the other portions of the component 18. Such a structure may provide for easier use and control when coupling and decoupling the component 18 to and from the latch mechanisms 40.

It should be appreciated that the bend angles, spacings, and geometry illustrated in the Figures and described above are not required and modifications may be made within various embodiments. Variables such as the socket size and shape, package size and shape amount of load desired, and height requirements may dictate changes to the design and remain within the scope of various embodiments. For example, the lever arms 30, 32 need not be parallel to each other in all embodiments. In addition, the hook mechanisms 42, while shown as separately coupled to the board 10, may also be coupled to a member and then the member coupled to the board 10. The latch mechanisms 40 may similarly be first coupled to a member and then the member coupled to the board 10, if desired.

Certain embodiments may provide one or more of the following advantages over conventional load mechanisms for applying a force to position a package in a socket. A first advantage is the ability to provide a large force, due to the multiple lever arms and regions. A second advantage is that embodiments have an extremely low profile. Certain conventional load mechanisms have included a thick frame which requires the use of a pedestal from the heatsink. Such thick frames and pedestals are not required, as seen, for example, in FIGS. 1-4. A third advantage is that the package itself is loaded, whereas certain conventional mechanisms apply a load to a heat spreader positioned on the die. Such loading can lead to excessive stresses on the die and/or solder bumps. By loading the package instead of the heat spreader, stresses to the die and solder bumps are minimized. A fourth advantage is the ability to open and close the system with a simple application of force using, for example, two fingers, instead of needing to perform multiple operations and use a tool to engage the components. A fifth advantage relates to the distributed loading. Instead of two point loading, embodiments may utilize distributed loading across a portion of the package, which causes less warpage to the package when loaded, which in turn encourages better contact between the package and socket.

Embodiments may also permit the use of a bare die package, where the loading is delivered directly to the die. The ability to spread the load and apply the load in equal amounts as described above leads to lower stresses being transmitted to the die.

Figure 5:
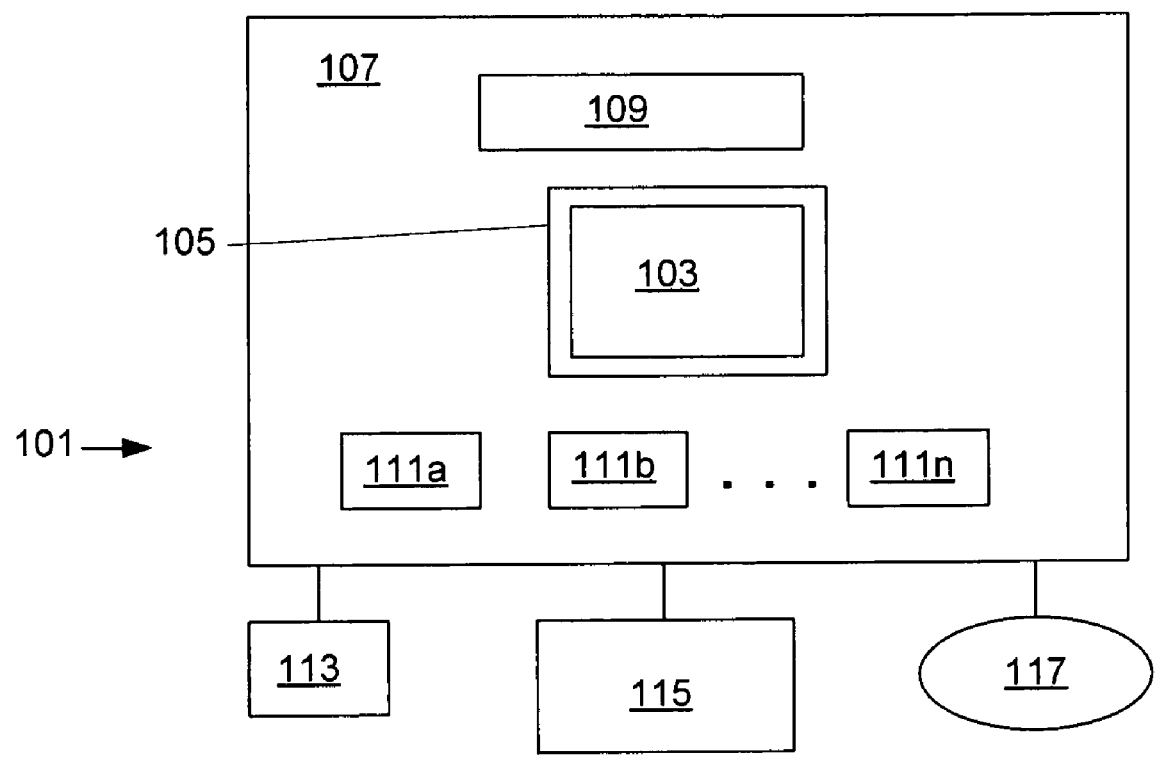
FIG. 5 illustrates an electronic system arrangement in which embodiments may find application.

Assemblies such as those described above may find application in a variety of electronic components. FIG. 5 schematically illustrates one example of an electronic system environment in which aspects of described embodiments may be embodied. Other embodiments need not include all of the features specified in FIG. 5, and may include alternative features not specified in FIG. 5.

The system 101 of FIG. 5 may include at least one central processing unit (CPU) 103. The CPU 103, also referred to as a microprocessor, may be a semiconductor die which is attached to an integrated circuit package substrate 105, which is then coupled to a printed circuit board 107, which in this embodiment, may be a motherboard. The package substrate 105 is an example of an electronic device which may be coupled to a socket on the printed circuit board 107 in accordance with embodiments as described herein. A variety of other system components, including, but not limited to memory and other components discussed below, may also be coupled to structures in accordance with the embodiments described above.

The system 101 may further include memory 109 and one or more controllers 111a, 111b . . . 111n, which are also disposed on the motherboard 107. The motherboard 107 may be a single layer or multi layered board which has a plurality of conductive lines that provide communication between the circuits in the package 105 and other components mounted to the board 107. Alternatively, one or more of the CPU 103, memory 109 and controllers 111a, 111b . . . 111n may be disposed on other cards such as daughter cards or expansion cards. The CPU 103, memory 109 and controllers 111a, 111b . . . 111n may each be seated in individual sockets or may be connected directly to a printed circuit board. A display 115 may also be included.

Any suitable operating system and various applications execute on the CPU 103 and reside in the memory 109. The content residing in memory 109 may be cached in accordance with known caching techniques. Programs and data in memory 109 may be swapped into storage 113 as part of memory management operations. The system 101 may comprise any suitable computing device, including, but not limited to, a mainframe, server, personal computer, workstation, laptop, handheld computer, handheld gaming device, handheld entertainment device (for example, MP3 (moving picture experts group layer-3 audio) player), PDA (personal digital assistant) telephony device (wireless or wired), network appliance, virtualization device, storage controller, network controller, router, etc.

The controllers 111a, 111b . . . 111n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 113 in accordance with a storage protocol layer. The storage protocol of the layer may be any of a number of known storage protocols. Data being written to or read from the storage 113 may be cached in accordance with known caching techniques. A network controller can include one or more protocol layers to send and receive network packets to and from remote devices over a network 117. The network 117 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications to the structures and methods described herein may occur to those having ordinary skill in the art.

What is claimed is:

1. An assembly comprising:
   a first lever arm and a second lever arm;
   a first axis portion extending from a first longitudinal end of the first lever arm;
   a second axis portion extending from a first longitudinal end of the second lever arm;
   a first load arm region extending from the first axis portion and the second axis portion and positioned between the first and second lever arms;
   a first handle region at a second longitudinal end of the first lever arm;
   a second handle region at a second longitudinal end of the second lever arm;
   a second load arm region extending from the first handle region;
   a third load arm region extending from the second handle region;
   the second and third load arm regions positioned between the first and second lever arms;
   a gap positioned between an end of the second load arm and an end of the third load arm region;
   the first handle region positioned to extend from the second longitudinal end of the first lever arm to the second load arm region;
   the second handle region positioned to extend from the second longitudinal end of the second lever arm to the third load arm region;
   a component coupled to a board;
   wherein the first load arm region, the second load arm region, and the third load arm region are each positioned to apply a force to the component; and
   wherein the component is positioned between the board and the first load arm region, the second load arm region, and the third load arm region.

2. The load mechanism of claim 1, wherein the load mechanism is formed from a wire.

3. The load mechanism of claim 1, wherein the first load arm region is substantially U-shaped.

4. The load mechanism of claim 1, wherein the second and third load arm regions are substantially L-shaped.

5. The load mechanism of claim 1, wherein the first lever arm is substantially parallel to the second lever arm.

6. The load mechanism of claim 1, wherein first and second lever arms, the first and second axis portions, the first and second handle regions, and the first, second, and third load arm regions are integrally formed.

7. An electronic assembly comprising:
   a circuit board;
   a socket coupled to the circuit board;
   a load mechanism including:
      a first lever arm and a second lever arm;
      a first axis portion extending from a first longitudinal end of the first lever arm, the first axis portion pivotally coupled to the circuit board;
      a second axis portion extending from a first longitudinal end of the second lever arm, the second axis portion pivotally coupled to the circuit board;
      a first load arm region extending from the first axis portion and the second axis portion and positioned between the first and second lever arms;
      a first handle region at a second longitudinal end of the first lever arm;
      a second handle region at a second longitudinal end of the second lever arm;
      a second load arm region extending from the first handle region;
      a third load arm region extending from the second handle region;
      the second and third load arm regions positioned between the first and second lever arms;
      the first handle region positioned to extend from the second longitudinal end of the first lever arm to the second load arm region;
      the second handle region positioned to extend from the second longitudinal end of the second lever arm to the third load arm region; and
      a gap positioned between an end of the second load arm and an end of the third load arm region;
   wherein the load mechanism is coupled to the circuit board;
   wherein the socket is positioned between the load mechanism and the circuit board; and
   a device positioned in the socket, wherein a sufficient force applied to the first and second handle regions will cause a portion of the first load arm region, a portion of the second load arm region, and a portion of the third load arm region to contact the device.

8. The electronic assembly of claim 7, further comprising first and second latch mechanisms coupled to the circuit board, wherein the first latch mechanism is adapted to engage a portion of the second load arm region, wherein the second latch mechanism is adapted to engage a portion of the third load arm region.

9. The electronic assembly of claim 7, wherein the device comprises a package, the package including a substrate having a die attach region on which a die is positioned, and wherein the portion of the first load arm region, the portion of the second load arm region, and the portion of the third load arm region that contact the device upon application of a sufficient force are positioned so that the contact is made on the substrate outside of the die attach area.

10. The electronic assembly of claim 7, wherein the device comprises a semiconductor die, and wherein the portion of the first load arm region, the portion of the second load arm region, and the portion of the third load arm region that contact the device upon application of a sufficient force are positioned so that the contact is made on the semiconductor die.

11. The electronic assembly of claim 7, wherein the first load arm region is substantially U-shaped.

12. The electronic assembly of claim 7, wherein the second and third load arm regions are substantially L-shaped.

13. The electronic assembly of claim 7, wherein the first lever arm is substantially parallel to the second lever arm.

14. The electronic assembly of claim 7, wherein first and second lever arms, the first and second axis portions, the first and second handle regions, and the first, second, and third load arm regions are integrally formed.

15. The electronic assembly of claim 7, wherein the second load arm region is coupled to the first lever arm through the first handle region, and wherein the third load arm region is coupled to the second lever arm through the second handle region.

16. An apparatus comprising:
a first lever arm and a second lever arm;
a first axis portion extending from a first end of the first lever arm;
a second axis portion extending from a first end of the second lever arm;
a first load arm region extending from the first axis portion and the second axis portion and positioned between the first and second lever arms;
a first handle region extending from a second end of the first lever arm;
a second handle region extending from a second end of the second lever arm;
a second load arm region, the second load arm region being coupled to the first lever arm through the first handle region;
a third load arm region, the third load arm region being coupled to the second lever arm through the second handle region;
a gap positioned between the second load arm region and the third load arm region;
a component coupled to a board;
wherein the first load arm region, the second load arm region, and the third load arm region are each positioned to apply a force to the component; and
wherein the component is positioned between the board and the first load arm region, the second load arm region, and the third load arm region.

17. The apparatus of claim 16, further comprising a die, wherein the first load arm region, the second load arm region, and the third load arm region are each in direct contact with the die.

18. The apparatus of claim 16;
wherein the first lever arm is substantially parallel to the second lever arm; and
wherein first and second lever arms, the first and second axis portions, the first and second handle regions, and the first, second, and third load arm regions are integrally formed.

* * * * *